United States Patent
Komuro et al.

(10) Patent No.: US 6,954,117 B2
(45) Date of Patent: Oct. 11, 2005

(54) ELECTRONIC COMPONENT INCLUDING PIEZO-ELECTRIC RESONATOR MOUNTED BY FACE-DOWN BONDING WITH A REQUIRED DIE SHEAR STRENGTH

(75) Inventors: Eiju Komuro, Tokyo (JP); Toshiyuki Nagatsuka, Tokyo (JP); Tsutomu Yasui, Tokyo (JP)

(73) Assignee: TDK Corporation, Tokyo (JP)

( * ) Notice: Subject to any disclaimer, the term of this patent is extended or adjusted under 35 U.S.C. 154(b) by 18 days.

(21) Appl. No.: 10/806,378

(22) Filed: Mar. 23, 2004

(65) Prior Publication Data

US 2005/0093649 A1 May 5, 2005

(30) Foreign Application Priority Data

Oct. 30, 2003 (JP) ........................................ 2003-370326

(51) Int. Cl.[7] .............................. H03H 9/05; H03H 9/52; H03H 9/54
(52) U.S. Cl. ........................ 333/133; 333/187; 333/192; 310/352; 257/778
(58) Field of Search ................................ 333/186–196, 333/133; 310/348, 352; 257/778

(56) References Cited

U.S. PATENT DOCUMENTS

| | | | | |
|---|---|---|---|---|
| 5,872,493 A | * | 2/1999 | Ella | 333/191 |
| 6,509,813 B2 | * | 1/2003 | Ella et al. | 333/187 |
| 6,550,664 B2 | * | 4/2003 | Bradley et al. | 228/179.1 |
| 6,557,225 B2 | * | 5/2003 | Takata et al. | 29/25.35 |
| 6,628,178 B2 | * | 9/2003 | Uchikoba | 333/193 |
| 6,698,084 B2 | * | 3/2004 | Uchikoba | 29/601 |
| 6,778,038 B2 | * | 8/2004 | Takeishi et al. | 333/133 |

FOREIGN PATENT DOCUMENTS

| | | |
|---|---|---|
| JP | 59-178011 | 10/1984 |
| JP | 10-107078 | * 4/1998 |
| JP | 10-270979 | 10/1998 |
| JP | 11-88111 | 3/1999 |
| JP | 2002-232253 | 8/2002 |
| JP | 2002-305218 | 10/2002 |
| JP | 2003-152500 | 5/2003 |
| JP | 2003-179518 | 6/2003 |

* cited by examiner

Primary Examiner—Barbara Summons
(74) Attorney, Agent, or Firm—McGinn & Gibb, PLLC

(57) ABSTRACT

In an electronic component having a piezo-electric resonator 10 formed on an element substrate 11 and obtaining a signal having a predetermined resonant frequency by a bulk wave propagating within a piezo-electric film 15, a mounting substrate 19 on which the piezo-electric resonator 10 is mounted by face-down bonding through N bumps 18, when a maximum diameter of said N bumps 18 is defined as D μm, die shear strength of said N bumps 18 is not smaller than ND/6 (g), preferably, not smaller than ND/3.6 (g).

6 Claims, 3 Drawing Sheets

IMMEDIATELY AFTER THE BUMP HAS BEEN FORMED

AFTER THE PIEZO-ELECTRIC RESONATOR HAS BEEN FLIP-CHIP MOUNTED

ELECTRONIC COMPONENT INCLUDING PIEZO-ELECTRIC RESONATOR MOUNTED BY FACE-DOWN BONDING WITH A REQUIRED DIE SHEAR STRENGTH

BACKGROUND OF THE INVENTION

The present invention relates to an electronic component, particularly to the electronic component which uses a piezo-electric resonator utilizing a balk wave propagating within a piezo-electric film.

A piezo-electric resonator capable of advantageously being made small in size is used in a duplexer for separating a transmission signal and a reception signal, for example, in a portable wireless communication apparatus.

In the duplexer using a conventional piezo-electric resonator, a transmission side filter and a reception side filter are fabricated into respective packages. The respective packages are contained in a package for an electric circuit substrate to form the duplexer. With this structure, the above-mentioned advantages of small size cannot be sufficiently obtained in the duplexer. As a result, the duplexer inevitably becomes large in size.

Under the circumstances, for the purpose of making the duplexer small in size, it can be considered that the piezo-electric resonator is mounted on a packaging substrate by a face-down bonding of a flip-chip using bumps (electrically connected projecting portion) in spite of a wire-bonding. By the flip-chip bonding, since a chip of the piezo-electric resonator can be electrically connected to the packaging substrate within an area of the chip, a two-dimensional space on the packaging substrate can be used efficiently. In addition, the duplexer can be made small in height, because the flip-chip bonding uses no wire that forms a loop and therefore needs a height to some extent.

Herein, a technique that the piezo-electric resonator is mounted on the packaging substrate by the flip-chip bonding is exemplified in, for example, Japanese laid open Official Gazettes No. 2002-232253, No. Hei 10-270979, respectively. Further, a technique that two piezo-electric resonators are mounted on the packaging substrate by the flip-chip bonding to form a duplexer is exemplified in, for example, Japanese laid open Official Gazettes No. Hei 11-88111, No. 2003-179518, respectively.

However, in the above-mentioned techniques, no description is made about shearing strength, particularly die shear strength.

The die shear strength is a value of a load obtained at the time when an IC (Integrated Circuit) chip (Herein, a piezo-electric resonator), that is mounted on a mounting substrate by a face-down bonding through electrically connected projecting portions (Herein, bumps), is pushed in a horizontal direction from the side thereof by the use of a shearing tool and thereby a junction portion between the IC chip and the mounting substrate or the IC chip itself is destroyed. If the die shear strength is not enough to a considerable extent, reliability against an impact is reduced.

In addition, the numbers or diameters of the bumps closely related to the die shear strength are different in respective piezo-electric resonators. It is therefore difficult to determine the value of the die shear strength enough to satisfy the above-mentioned reliability.

SUMMARY OF THE INVENTION

It is therefore an object of the present invention to provide a technique capable of satisfying a required die shear strength on an electronic component that a piezo-electric resonator is mounted by a face-down bonding.

Other objects of the present invention will become clear as the description proceeds.

According to an aspect of the present invention, there is provided an electronic component, comprising: a piezo-electric resonator which is formed on an element substrate and which has a piezo-electric film, the piezo-electric resonator obtaining a signal having a predetermined resonant frequency by a bulk wave propagating within the piezo electric film; a mounting substrate on which the piezo-electric resonator is mounted by a face-down bonding through N electrically connected projecting portions; and, when a maximum diameter of the N electrically connected projecting portions being defined as D $\mu$m after the piezo-electric resonator is mounted to the mounting substrate, die shear strength of the N electrically connected projecting portions being not smaller than ND/6 (g).

The die shear strength of the N electrically connected projecting portions may be preferably not smaller than ND/3.6 (g).

The N electrically connected projecting portions may be formed by gold.

The piezo-electric resonator may be an SMR type piezo-electric resonator.

The piezo-electric resonator may have an acoustic multi-layer film between the element substrate and the piezo-electric film.

A couple of the piezo-electric resonators may be mounted on the mounting substrate, one being a transmission side filter for processing a transmission signal while another being a reception side filter for processing a reception signal.

DETAILED DESCRIPTION OF THE PREFERRED EMBODIMENT

Now, referring to FIGS. 1, 2, 3A and 3B, description will proceed to an electronic component according to a preferred embodiment of the present invention.

Figure 1:
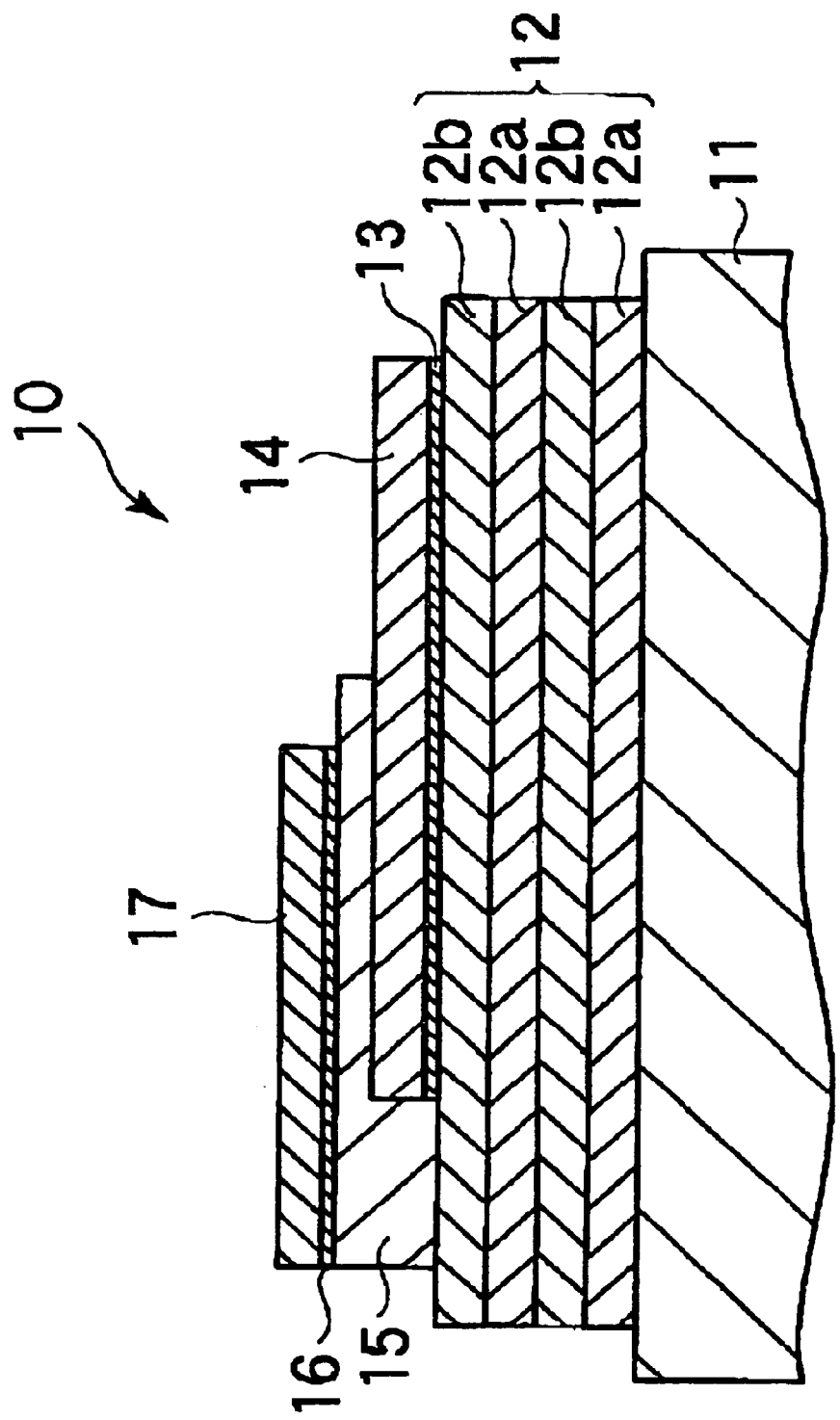
FIG. 1 is a sectional view for schematically showing a piezo-electric resonator used in an electronic component according to a preferred embodiment of the present invention.
Figure 2:
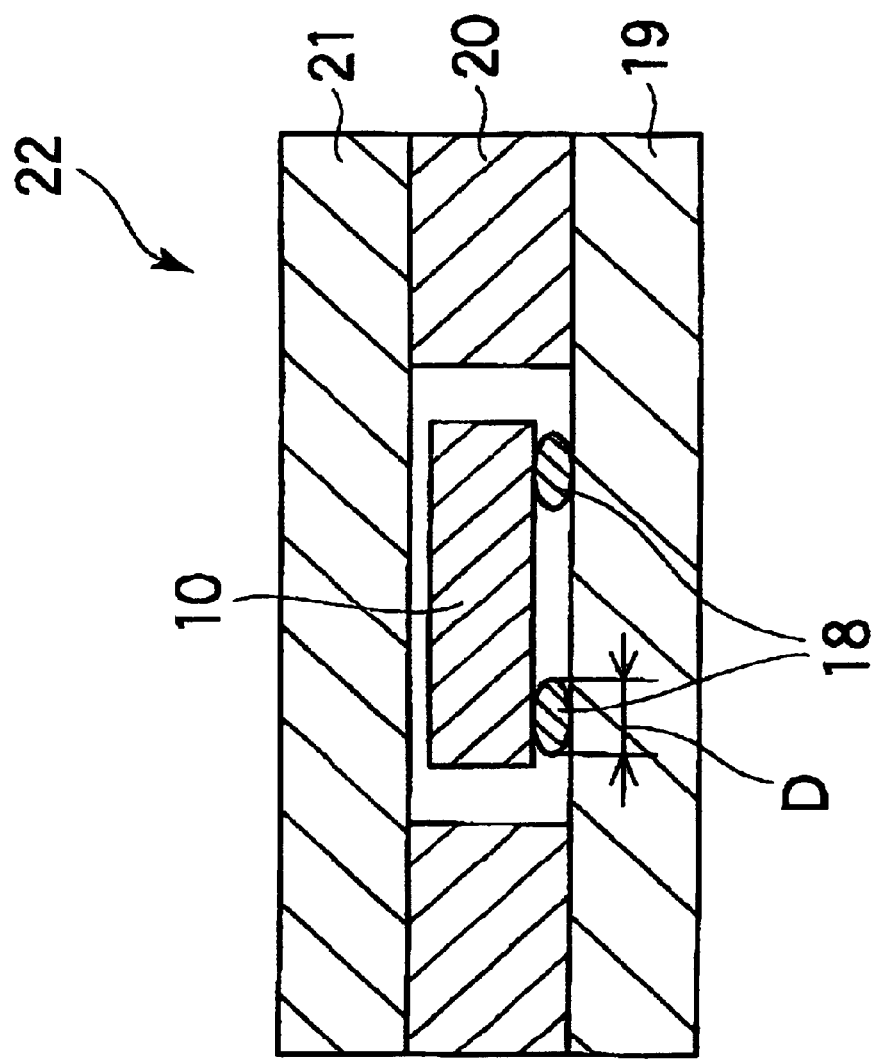
FIG. 2 is a sectional view for schematically showing the electronic component according to the preferred embodiment of the present invention.
Figure 3A:
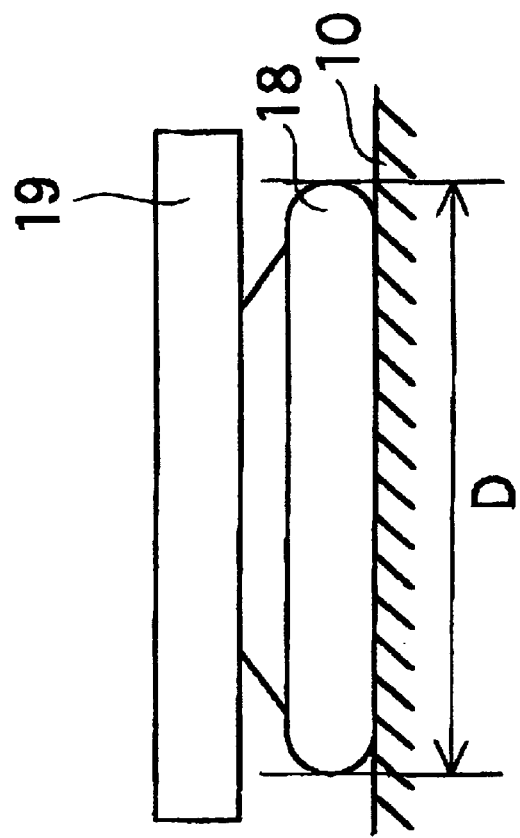
FIG. 3A is an explanation view for schematically showing a bump formed in the piezo-electric resonator used in the electronic component according to the preferred embodiment of the present invention, in a condition of the bump that the piezo-electric resonator is not yet mounted, immediately after the bump has been formed.
Figure 3B:
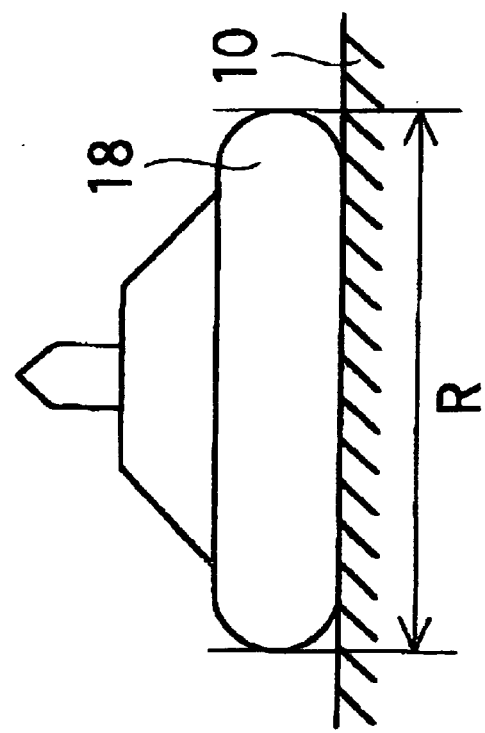
FIG. 3B is an explanation view for schematically showing a bump formed in the piezo-electric resonator used in the electronic component according to the preferred embodiment of the present invention, in a condition of the bump after the piezo-electric resonator has been flip-chip mounted.

FIG. 1 shows a piezo-electric resonator used in an electronic component according to a preferred embodiment of the present invention. FIG. 2 shows the electronic component in which the piezo-electric resonator illustrated in FIG. 1 is included. FIG. 3A shows a bump formed in the piezo-electric resonator illustrated in FIG. 1, in a condition of the bump that the piezo-electric resonator is not yet mounted, immediately after the bump has been formed. FIG. 3B shows a bump formed in the piezo electric resonator illustrated in FIG. 1, in a condition of the bump after the piezo-electric resonator has been flip-chip mounted.

A piezo-electric resonator 10 illustrated in FIG. 1 is such a piezo-electric resonator that is called "SMR(Solidly Mounted Resonator) type piezo-electric resonator". In the piezo-electric resonator 10, an acoustic reflection film 12 composed of two thin films each having high acoustic impedance, for example, AlN films 12a and two thin films each having low acoustic impedance, for example, SiO2 films 12b is formed on an element substrate 11 consisting substantially of, for example, single crystal silicon with the respective four thin films being stacked alternately. A Pt film is deposited on the acoustic reflection film 12 by a vacuum deposition method through an AlN film as an adhesion layer 13. The Pt film is subjected to patterning by lithography to form a lower electrode 14.

Further, a piezo-electric film 15 of ZnO is deposited on the lower electrode 14 by a sputtering method. An Al film is deposited on the piezo-electric film 15 also by the sputtering method through a Cr film as an adhesion layer 16. The Al film is subjected to patterning by lithography to form an upper electrode 17. Besides, a thickness of the piezo-electric film 15 is generally not larger than 10 μm. It is therefore difficult to make the piezo-electric resonator 10 without using the element substrate 11. Further, a hole or holes can be formed on the piezo-electric film 15 by etching or the like so that the lower electrode 14 may be exposed.

In the piezo-electric resonator 10 thus mentioned, bumps (electrically connected projecting portions) 18, such as stud bumps, plating bumps and the like are formed on the lower electrode 14 and the upper electrode 17, as illustrated in FIGS. 2 and 3. Accordingly, let the piezo-electric resonator 10 be mounted on a mounting substrate 19 described later and then let alternating voltage be applied on the lower electrode 14 and the upper electrode 17. Consequently, a bulk wave propagates within the piezo-electric film 15 by piezo-electric effect and thereby a signal having a predetermined resonant frequency can be obtained.

Besides, the acoustic reflection film 12 may not be formed. In this case, the lower electrode 14 is formed directly on the element substrate 11. Further, the acoustic reflection film 12 is composed of four layers in this embodiment. The number of the layers of the acoustic reflection film 12 is not restricted to four. The acoustic reflection film 12 may be composed of any other number of thin films, when the thin films having acoustic impedances different from each other are stacked alternately. Further, a material of each thin film is not restricted to the above-mentioned one. The above-mentioned material is merely one example thereof. Further, solder, gold, aluminum, copper and the like can be applied to the bumps 18.

However, in a case that the solder is applied to the bumps 18, fluxes are likely to be scattered on a surface of the piezo-electric resonator 10 during solder heating and melting process. Further, in the case, impurities, such as melted flux of washing solution and the like are likely to remain after washing process. On the contrary, in a case that the gold is applied to the bumps 18, there is no fear of scattered fluxes and remaining impurities. It is therefore desirable that the bumps 18 are formed by gold.

As illustrated in FIGS. 2 and 3, the piezo-electric resonator 10 is mounted on the mounting substrate 19 through the bumps 18 by the face-down bonding. An annular spacer 20 is fixed in a peripheral portion of the mounting substrate 19. A lid (sealing member) 21 is fixed on the annular spacer 20, so that the piezo-electric resonator 10 is sealed to form an electronic component 22.

Besides, in the illustrated example, the mounting substrate 19 and the lid 21 are fixed each other through the annular spacer 20. Alternatively, the mounting substrate 19 and the lid 21 may be directly fixed each other. This is achieved, for example, by making a wall of the peripheral portion of the mounting substrate 19, or by rendering the lid 21 to have a cap-like shape.

Besides, as regards the electrodes in the mounting substrate 19 to which the bumps are connected, in a case that, for example, Cu is used in the electrodes, the piezo-electric resonator having the bumps formed thereon cannot be connected with the electrodes, as it stands. In other words, it is necessary that Ni layer, of which thickness may be 3 through 5 μm, is deposited on Cu which forms the electrodes. It is further necessary that an Au layer, of which thickness may not be smaller than 300 angstroms (Å), is deposited on the Ni layer. At that time, it is also necessary that the mounting substrate 19 having the electrodes is subjected to plasma processing. On the other hand, in a case that a ceramic substrate (for example, Low Temperature Co-fired Ceramic, called LTCC) is used as the mounting substrate 19, similar processing is required. Namely, it is necessary that Ni layer, of which thickness may be 3 through 5 μm, is deposited on an Ag electrodes. It is further necessary that an Au layer, of which thickness may not be smaller than 300 angstroms (Å), is deposited on the Ni layer.

Herein, inventors of the present invention fabricated the electronic component 22 in which the piezo-electric resonator 10 is mounted on the mounting substrate 19 by the face-down bonding through eight bumps. Subsequently, investigation was then made about shearing strength in the electronic component 22 thus mentioned.

The shearing strength in this embodiment is a value of a load obtained at the time when one bump 18 formed on the piezo-electric resonator 10 is pushed in a horizontal direction from the side thereof by the use of a shearing tool and thereby a junction plane of the bump 18 is destroyed. On the other hand, the die shear strength in this embodiment is a value of a load obtained at the time when the piezo-electric resonator 10, that is mounted on the mounting substrate 19 by a face-down bonding through the bumps 18, is pushed in a horizontal direction from the side thereof by the use of a shearing tool and thereby a junction plane between the piezo-electric resonator 10 and the mounting substrate 19 is destroyed. Namely, the die shear strength in this embodiment is estimating the value of the load for all the bumps 18 and defined as a junction strength of the piezo-electric resonator 10 with respect to the mounting substrate 19. As a result, the die shear strength in this embodiment can be calculated as the product of (shearing strength per each one bump) by (the number of the bumps), although errors are included more or less in the sum. Accordingly, the specification in the present application uses this definition.

Besides, the shearing strength of the bump can be varied by a load, an output of ultrasonic waves, time period during applying the ultrasonic waves, and a surface condition of the die (in other words, whether or not plasma processing has been conducted) at the time that the bump is pushed and fixed on the die chip, namely the piezo-electric resonator 10.

Further, a heat-cycle test is carried out for the electronic component 22 in this embodiment. In a table 1, depicted are diameters of the bumps, shearing strengths, and results of the heat-cycle test.

TABLE 1

| SAMPLE GROUP NUMBER | BUMP DIAMETER R (μm) | SHEAR STRENGTH (g) | BUMP DIAMETER D (μm) | DIE SHEAR STRENGTH (g) | RESULT OF HEAT-CYCLE TEST |
|---|---|---|---|---|---|
| 1 | 100 | 20 (R/5) | 120 | 160 | RESULT 1 (Approximately 1%) |
| 2 | 100 | 33 (R/3) | 120 | 264 | RESULT 2 |
| 3 | 60 | 12 (R/5) | 72 | 96 | RESULT 1 (Approximately 3%) |
| 4 | 60 | 20 (R/3) | 72 | 160 | RESULT 2 |
| 5 | 80 | 16 (R/5) | 96 | 128 | RESULT 1 (Approximately 2%) |
| 6 | 80 | 27 (R/3) | 96 | 216 | RESULT 2 |
| 7 | 120 | 24 (R/5) | 144 | 192 | RESULT 1 (Approximately 2%) |
| 8 | 120 | 40 (R/3) | 144 | 320 | RESULT 2 |
| 9 | 150 | 30 (R/5) | 180 | 240 | RESULT 1 (Approximately 1%) |
| 10 | 150 | 50 (R/3) | 180 | 400 | RESULT 2 |
| 11 | 150 | 22 (R/7) | 180 | 176 | RESULT 3 |
| 12 | 120 | 20 (R/6) | 144 | 160 | RESULT 3 |
| 13 | 80 | 24 (R/3.3) | 96 | 192 | RESULT 1 (Approximately 0.3%) |
| 14 | 120 | 35 (R/3.4) | 144 | 303 | RESULT 1 (Approximately 0.2%) |
| 15 | 80 | 14 (R/5.7) | 96 | 118 | RESULT 3 |
| 16 | 100 | 18 (R/5.5) | 120 | 152 | RESULT 3 | wherein the sample group is such a group that is formed by a plurality of samples having the same diameters of the bumps and the same shearing strengths as each other.

Further, the bump diameter R is the maximum diameter of each bump in a condition that the piezo-electric resonator 10 is not yet mounted, immediately after the bump has been formed on the piezo-electric resonator 10. On the other hand, the bump diameter D is the maximum diameter of each bump in a condition thereof after the piezo-electric resonator 10 has been flip-chip mounted. These are depicted in FIGS. 3A and 3B, respectively. Namely, let the maximum diameter of the bump illustrated in FIG. 3A that the piezo-electric resonator 10 is not yet mounted be defined as R. Ultrasonic waves are applied on the bump in a certain direction thereof, when the piezoelectric resonator 10 is flip-chip mounted. Accordingly, the bump is deformed, as if the bump is crushed. As a result, the maximum diameter D of the bump illustrated in FIG. 3B after the piezo-electric resonator 10 has been mounted becomes larger by fifteen through twenty percentages at the most than the maximum diameter R of the bump illustrated in FIG. 5A that the piezo-electric resonator 10 is not yet mounted. Subsequently, in order to distinguish the bump diameters before and after the mounting of the piezo-electric resonator 10 from each other, two kinds of the maximum diameters thus defined are used in this embodiment A two-dimensional configuration of the bump after the bump has been deformed usually becomes an oval configuration or an elliptic configuration. Besides, the diameters of the bumps were measured by two-dimensionally projected configurations thereof.

Further, R/. . . in parenthesis of a row of the shearing strength represents a relation between the shearing strength and the bump diameter R.

In addition, in a row of the result of heat-cycle test, the result 1 is such a result that, in the heat-cycle test of −40° C. through 85° C. (each thirty minutes), no problem was caused to occur after one hundred hours have been passed, but that predetermined percentages of samples each including at least one bump having a crack were confirmed in one hundred to two hours of the heat-cycle test. Besides, approximately. . . % in parenthesis of the row of the result of heat-cycle test represents a rate of generation of the samples each including at least one bump having a crack.

Further, the result 2 is such a result that, in the heat-cycle test of −40° C. through 85° C. (each thirty minutes), no problem was caused to occur after two hundreds hours have been passed. Furthermore, the result 3 is such a result that, in the heat-cycle test of −40° C. through 85° C. (each thirty minutes), not fewer than ten percentages of samples each including at least one bump having a crack among eight bumps were confirmed within fifty hours have been passed.

As depicted in the table 1, the results 1 were obtained in the sample group numbers 1, 3, 5, 7, 9, 13, 14, respectively. Further, the results 2 were obtained in the sample group numbers 2, 4, 6, 8, 10, respectively. Furthermore, the results 3 were obtained in the sample group numbers 11, 12, 15, 16, respectively.

Herein, when the number of the bumps is assumed as N, definition was made about relations between the number of the bumps, the bump diameter D, and the die shear strength. Accordingly, the followings can be confirmed. Namely, (the die shear strength) is equal to ND/6 (g), ND/4 (g), and ND/3.8 (g) in the result 1. Further, (the die shear strength) is equal to ND/3.6 (g) in the result 2. Furthermore, (the die shear strength) is equal to ND/8.18 (g), ND/7.2 (g), ND/6.5 (g), and ND/6.3 (g) in the result 3.

In view of these, it is considered that the result 1 can be obtained, when the die shear strength is not smaller than ND/6 (g). It is also considered that the result 2 can be obtained, when the die shear strength is not smaller than ND/3.6 (g). Under the situations, a good result is the result 1 while a better result is the result 2. Therefore, a required die shear strength can be obtained by rendering the die shear strength to be not smaller than ND/6 (g), preferably not smaller than ND/3.6 (g). Namely, the die shear strength becomes enough to the required level, so that reliability against an impact is not reduced.

While this invention has thus far been described in specific conjunction with only a preferred embodiment thereof it will now be readily possible for one skilled in the art to put this invention into effect in various other manners.

For example, the above description was made about a case that the present invention is applied to the SMR type piezo-electric resonator. The present invention can be applied to all of a stacked-type piezo-electric resonator using a piezo-electric film, such as a diaphragm type piezo-electric resonator in which acoustic total reflection is carried out by opening a piezo-electric film interposed between upper and lower electrodes to the air in the upper and the lower directions thereof, a space-type piezo-electric resonator and the like. However, it is in danger in the diaphragm type piezo-electric resonator that an element substrate is sometimes flexed, that a crack is generated in the element substrate during a junction process using ultrasonic waves and the like. On the contrary, since the SMR type piezo-electric resonator does not have such a danger, it is desirable that the present invention is applied to the SMR type piezo-electric resonator.

Further, in the electronic component 22 illustrated in FIG. 2, one piezo-electric resonator 10 is mounted on the mounting substrate 19. However, the present invention can be applied to an electronic component in which plurality of piezo-electric resonators are mounted on the mounting substrate. Namely, the present invention can be applied to, for example, a duplexer including two piezo-electric resonators mounted on the mounting substrate, in which one of the two piezo-electric resonators forms a transmission side filter for processing a transmission signal while another one thereof forms a reception side filter for processing a reception signal.

What is claimed is:

1. An electronic component, comprising:

a piezo-electric resonator which is formed on an element substrate and which has a piezo-electric film, said piezo-electric resonator obtaining a signal having a predetermined resonant frequency by a bulk wave propagating within said piezo-electric film;

a mounting substrate on which said piezo-electric resonator is mounted by a face-down bonding through N electrically connected projecting portions; and when a maximum diameter of said N electrically connected projecting portions is defined as D $\mu$m after said piezo-electric resonator is mounted on said mounting substrate, die shear strength of said N electrically connected projecting portions being not smaller than ND/6 (g).

2. An electronic component as claimed in claim 1, wherein said die shear strength of said N electrically connected projecting portions being not smaller than ND/3.6 (g).

3. An electronic component as claimed in claim 1, wherein said N electrically connected projecting portions are formed by gold.

4. An electronic component as claimed in claim 1, wherein said piezo-electric resonator is an SMR type piezo-electric resonator.

5. An electronic component as claimed in claim 1, wherein said piezo-electric resonator has an acoustic multi-layer film between said element substrate and said piezo-electric film.

6. An electronic component as claimed in claim 1, wherein a couple of said piezoelectric resonators are mounted on said mounting substrate, one being a transmission side filter for processing a transmission signal while another being a reception side filter for processing a reception signal.

* * * * *